(12) United States Patent
Schippel et al.

(10) Patent No.: US 10,038,091 B2
(45) Date of Patent: Jul. 31, 2018

(54) SEMICONDUCTOR DEVICE AND METHOD

(71) Applicant: GLOBALFOUNDRIES Inc., Grand Cayman (KY)

(72) Inventors: Christian Schippel, Dresden (DE); Alban Zaka, Dresden (DE); Ignasi Cortes Mayol, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/198,038

(22) Filed: Jun. 30, 2016

(65) Prior Publication Data

US 2017/0317209 A1 Nov. 2, 2017

Related U.S. Application Data

(60) Provisional application No. 62/328,100, filed on Apr. 27, 2016.

(51) Int. Cl.
| | |
|---|---|
| *H01L 29/78* | (2006.01) |
| *H01L 29/10* | (2006.01) |
| *H01L 29/08* | (2006.01) |
| *H01L 29/167* | (2006.01) |
| *H01L 29/06* | (2006.01) |
| *H01L 29/45* | (2006.01) |
| *H01L 21/265* | (2006.01) |
| *H01L 21/762* | (2006.01) |
| *H01L 29/66* | (2006.01) |

(52) U.S. Cl.
CPC .... *H01L 29/7824* (2013.01); *H01L 21/26513* (2013.01); *H01L 21/76224* (2013.01); *H01L 29/0649* (2013.01); *H01L 29/0847* (2013.01); *H01L 29/1079* (2013.01); *H01L 29/167* (2013.01); *H01L 29/45* (2013.01); *H01L 29/66681* (2013.01)

(58) Field of Classification Search
CPC ............ H01L 29/7824; H01L 29/1079; H01L 29/0847; H01L 29/167; H01L 29/0649; H01L 29/45; H01L 21/26513; H01L 21/76224; H01L 29/66681
See application file for complete search history.

(56) References Cited

U.S. PATENT DOCUMENTS

| | | | |
|---|---|---|---|
| 9,059,282 B2 * | 6/2015 | Hodel | H01L 21/823828 |
| 9,704,756 B2 * | 7/2017 | Hodel | H01L 21/823493 |
| 2009/0166673 A1 * | 7/2009 | Benaissa | H01L 29/66325 257/141 |

* cited by examiner

*Primary Examiner* — Hrayr A Sayadian
(74) *Attorney, Agent, or Firm* — Amerson Law Firm, PLLC

(57) ABSTRACT

The present disclosure provides a semiconductor device including a substrate, a first well and a second well formed in the substrate, the first well being doped with dopants of a first conductivity type and the second well being doped with dopants of a second conductivity type, a third well within the first well, a gate structure partially formed over the first and second wells, and a first epi region on the third well and a drain region electrically coupled to the second well, the first epi region being doped with dopants of the second conductivity type.

20 Claims, 5 Drawing Sheets

SEMICONDUCTOR DEVICE AND METHOD

BACKGROUND OF THE INVENTION

1. Field of the Invention

The present disclosure relates to semiconductor devices and to a method of forming semiconductor devices, and, more particularly, to field effect transistors in fully depleted silicon-on-insulator technologies at advanced technology nodes, such as 22 nm and beyond.

2. Description of the Related Art

In recent years, lateral double-diffused MOS transistors (LDMOSFETs) have been increasingly applied in high voltage and smart power applications. The advantages over vertical double-diffused MOSFETs (VDMOSFETs) are a reduction in the number of application steps, multiple output capability on the same chip, and compatibility with advanced very large scale integration (VLSI) technologies. LDMOSFETs with VLSI processes are expected to drive ICs to wider fields of complex applications, such as intelligent power ICs. Actually, with the internet of things (IoT) or internet of everything becoming a term that is more and more popular, IoT promises a vast field of application in medical, automotive, industrial, metrology, fitness and more applications. These different applications largely have several requirements in common, such as cost sensitivity, long battery life, and increasingly wireless connectivity. Particularly, the latter requirement of wireless connectivity demands wireless interfaces requiring radio frequency (RF). Recently, a process at 28 nm targeting at IoT in mobile applications has been proposed, this process adding RF modeling to high-K metal gate (HKMG) processes, being designed for devices that require those standby power and long battery life integrated with RF/wireless functionality.

Generally, LDMOSFETs implement an asymmetric structure with a drift region located between the LDMOSFET's channel and drain contact. With regard to FIG. 1a, a schematic cross-section of an LDMOSFET 100a in accordance with bulk technologies is schematically illustrated. The LDMOSFET 100a comprises a bulk substrate 110a having a first well 112a and a second well 114a formed in an upper surface portion of the bulk substrate 110a. The first well 112a and the second well 114a are doped with dopants of opposite conductivity types, i.e., P-type and N-type dopants. Overlying an interface between the first well 112a and the second well 114a, a gate electrode 120a is disposed over the bulk substrate 110a, the gate structure 120a partially covering the upper surface regions of the first well 112a and the second well 114a. The gate structure 120a has a gate stack 122a comprising a gate dielectric (not illustrated) and a gate electrode material (not illustrated). The person skilled in the art will appreciate that the gate dielectric and the gate electrode material, though not explicitly illustrated in FIG. 1a, are formed in accordance with known gate formation techniques, and sidewalls of the gate stack 122a are covered with a sidewall spacer 124a. A source region 132a is provided within the first well 112a in alignment with the gate structure 120a, wherein a lateral distance between the source region 132a and the gate stack 122a is adjusted by means of the sidewall spacer 124a.

As illustrated in FIG. 1a, a drain region 134a is formed within the second well 114a. The drain region 134a is substantially doped with dopants of the same conductivity type as the second well 114a. A concentration of dopants of the second conductivity type within the drain region 134a is substantially higher than a concentration of dopants of the second conductivity type within the second well 114a. For example, in order to implement an NLDMOSFET, the source and drain regions 132a and 134a are strongly doped with N-type dopants, i.e., the source and drain regions 132a, 134a are N+ regions. The first well 112a is doped with P-type dopants implementing a P-well, while the second well 114a is doped with N-type dopants for forming an N-well.

With regard to FIG. 1a, extension regions and halo regions may be provided within the first well 112a, as indicated by reference numeral 136a, for adjusting the threshold voltage of the LDMOSFET 100a. The gate electrode 120a covers the surface of the channel within the first well 112a and the drift region within the second well 114a. The drift region within the second well 114a being covered by the gate structure 120a extends into a long drift region indicating a spacing between the gate structure 120a and the drain region 134a. Accordingly, the LDMOSFET as illustrated in FIG. 1a has three major serial resistance components in accordance with the channel region in the first well 112a below the gate structure 120a, the drift region within the second well 114a below the gate structure 120a, and the long drift region within the second well 114a extending beyond the gate structure 120a to the drain region 134a. For LDMOSFETs in high voltage applications, the dominant part among these serial resistance components is given by the drift region within the second well 114a below the gate structure 120a and the long drift region within the second well 114a beyond the gate structure 120a to the drain region 134a. Accordingly, for LDMOSFETs in high voltage applications, the dominant part among these serial resistance components is the drift resistance provided by the drift region and the long drift region, receiving the high voltage drop along the LDMOSFET 100a.

As illustrated in FIG. 1a, a back bias contact region 138a is formed within the first well 112a, the back bias contact region 138a being enclosed by STI regions 142a, 144a separating the back bias contact region 138a and the source region 132a. The back bias contact region 138a is doped with dopants of the same conductivity type as the first well 112a, having a higher concentration of dopants than the first well 112a. Accordingly, the back bias contact region 138a represents a highly doped region 138a within the first well 112a.

With regard to FIG. 1b, an LDMOSFET 100b is schematically illustrated in a cross-sectional view, the LDMOSFET 100b being formed in accordance with a pure slave FDSOI semiconductor device construction. The term "pure slave" indicates that the LDMOSFET 100b uses technology components, mostly implants, which are already required for by other baseline devices and, therefore, the LDMOSFET 100b is integrated in accordance with processes employed in the baseline for forming semiconductor devices at 28 nm and above. Particularly, the LDMOSFET 100b is not formed by dedicated process features and, therefore, does not require additional mask layers in the process flow.

Although the LDMOSFET 100b is formed in accordance with FDSOI techniques, the LDMOSFET 100b is provided in and above a bulk substrate 110b which is part of an SOT substrate (the term "silicon-on-insulator" or "SOT" indicating a substrate configuration having an active semiconductor layer which is separated from a bulk substrate below by means of an interposed buried oxide (BOX) layer). Particularly, the LDMOSFET 100b is formed within a bulk exposed region of the SOT substrate, that is, a local region of the SOT substrate (not illustrated), where the active semiconductor layer (not illustrated) and the BOX layer (not illustrated) are locally removed to locally expose an upper surface of the underlying bulk substrate 110b. For example, bulk exposed regions or BULEX regions may be formed when implementing back bias in FDSOI technologies, wherein back bias contacts regions are formed adjacent to VDMOSFETs, the back bias contacts being electrically coupled to the BULEX regions.

With regard to FIG. 1b, the bulk substrate 110b has a first well 112b and a second well 114b formed in an upper surface portion of the bulk substrate 110b. The first well 112b and the second well 114b are doped with dopants of opposite conductivity types, i.e., P-type and N-type dopants. Overlying an interface between the first well 112b and the second well 114b, a gate electrode 120b is disposed over the bulk substrate 110b, the gate structure 120b partially covering the upper surface regions of the first well 112b and the second well 114b. Similar to the gate structure 120a, the gate structure 120b has a gate stack 122b comprising a gate dielectric (not illustrated) and a gate electrode material (not illustrated). The person skilled in the art will appreciate that the gate dielectric and the gate electrode material, though not explicitly illustrated in FIG. 1b, are formed in accordance with known gate formation techniques, and sidewalls of the gate stack 122b are covered with a sidewall spacer 124b.

A source region 132b is provided on the first well 112b in alignment with the gate structure 120b, wherein a lateral distance between the source region 132b and the gate stack 122b is adjusted by means of the sidewall spacer 124b. As opposed to the LDMOSFET 100a, the source region 132b is formed by an epitaxially grown region which is in alignment with the gate stack 122b.

Furthermore, a drain region 134b is formed on the second well 114b. The drain region 134b is substantially doped with dopants of the same conductivity type as the second well 114b. A concentration of dopants of the second conductivity type within the drain region 134b is substantially higher than a concentration of dopants of the second conductivity type within the second well 114b. The drain region 134b is, as the source region 132b, an epitaxially grown region, which may be formed when growing the source region 132b.

Similar to the description of FIG. 1a above, an NLDMOSFET may be implemented by the source region 132b and the drain region 134b being strongly doped with N-type dopants, i.e., the source region 132b and the drain region 134b are N+ regions. In case the first well 112b is doped with P-type dopants implementing a P-well, the second well 114b is doped with N-type dopants for forming an N-well.

Similar to FIG. 1a above, a back bias contact region 138b is formed within the first well 112b, the back bias contact region 138b being laterally enclosed by STI regions 142b, 144b separating the back bias contact region 138b and the source region 132b. The back bias contact region 138b is doped with dopants of the same conductivity type as the first well 112b, having a higher concentration of dopants than the first well 112b. The back bias contact region 138b represents a highly doped region 138b formed on the first well 112b as an epitaxially grown region. An STI region 146b separates the drain region 134b and the gate structure 120b.

FIG. 1b shows a direct port of an LDMOS design of bulk technologies to FDSOI technologies, that is, the fabrication of LDMOSFET devices as described above with regard to FIG. 1a is directly transferred into FDSOI process flows as pure slave LDMOS devices.

Irrespective of the type of LDMOSFET, that is, the LDMOSFET 100a or the LDMOSFET 100b, the integration of pure slave LDMOSFETs makes extensive use of logic device construction elements, such as forming well regions in the device body, forming of complementary well regions for the drain drift region and the formation of source/drain regions, either by implanting the source/drain regions or epitaxially growing source/drain regions.

The major difference in LDMOSFET 100b with respect to LDMOSFET 100a, however, is the absence of extension and halo regions, because they are not required for baseline SOI devices. It turns out that, upon employing bulk and FDSOI techniques in slave LDMOS process flows, body/drain extension implants (wells 112b and 114b) may cause a very high threshold voltage, a very high subthreshold slope, and a strong hot carrier injection (HCI). The root cause is the high surface dopant concentration in the FDSOI wells. They are intended as backgates for the SOI devices and need to be highly doped to avoid gate depletion effects.

Furthermore, the formation of source/drain connections causes a degraded source/channel connection, which cannot be cured by implanting extensions.

In view of the above discussion, it is desirable to provide a semiconductor device and a method improving source/channel connection and reducing the threshold voltage, as well as the subthreshold slope and improving HCI.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present invention, a semiconductor device is provided. In accordance with illustrative embodiments herein, the semiconductor device includes a substrate, a first well and a second well formed in the substrate, the first well being doped with dopants of a first conductivity type and the second well being doped with dopants of a second conductivity type, a third well within the first well, a gate structure partially formed over the first, second and third wells, and a first epi region on the third well and a drain region electrically coupled to the second well, the first epi region being doped with dopants of the second conductivity type.

In a second aspect of the present disclosure, a method is provided. In accordance with illustrative embodiments herein, the method includes forming a first well and a second well in a substrate, the first well being doped with dopants of a first conductivity type and the second well being doped with dopants of a second conductivity type, forming a third well within the first well, forming a gate structure over the first, second and third wells, the gate structure partially overlying each of the first and second wells, forming a first epi region on the third well, the first epi region being doped with dopants of the second conductivity type, and providing a drain region, wherein the drain region is electrically coupled to the second well.

BRIEF DESCRIPTION OF THE DRAWINGS

The disclosure may be understood by reference to the following description taken in conjunction with the accompanying drawings, in which like reference numerals identify like elements, and in which.

Figure 1A:
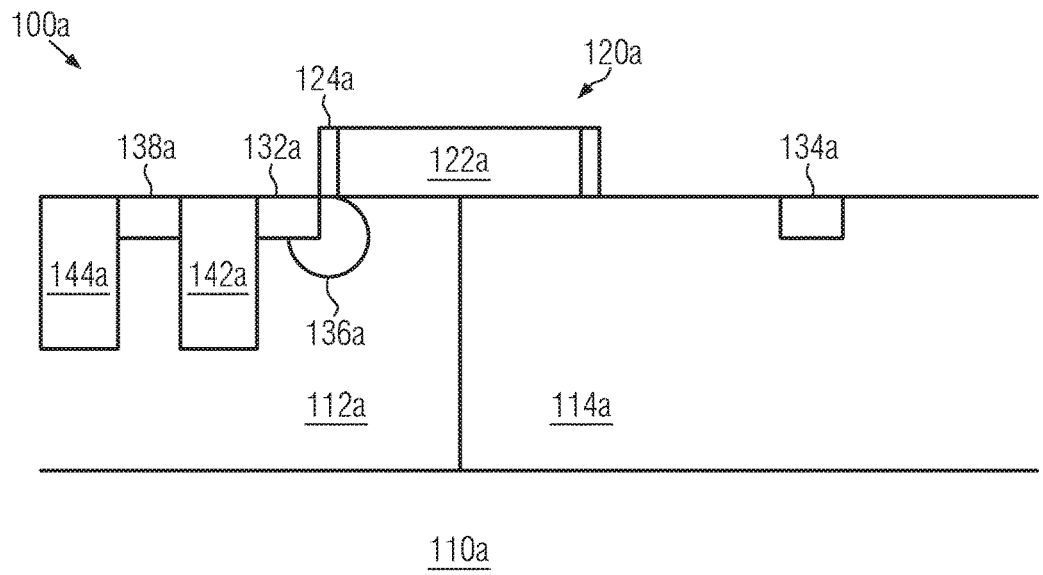
FIGS. 1a-1b schematically illustrate LDMOSFETs as known in the art.
Figure 1B:
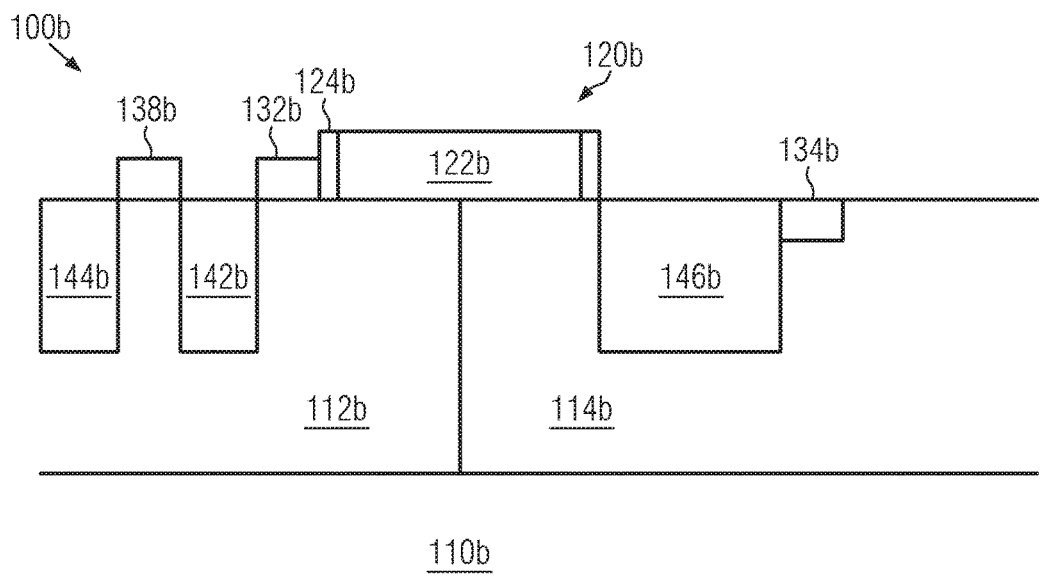

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless or otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Semiconductor devices, such as PMOS and NMOS devices, of the present disclosure may concern structures which are fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. The person skilled in the art will appreciate that, according to the present disclosure, ground rules smaller or equal to 45 nm, e.g., at 22 nm or below, may be imposed. The person skilled in the art will appreciate that the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like.

Figure 2A:
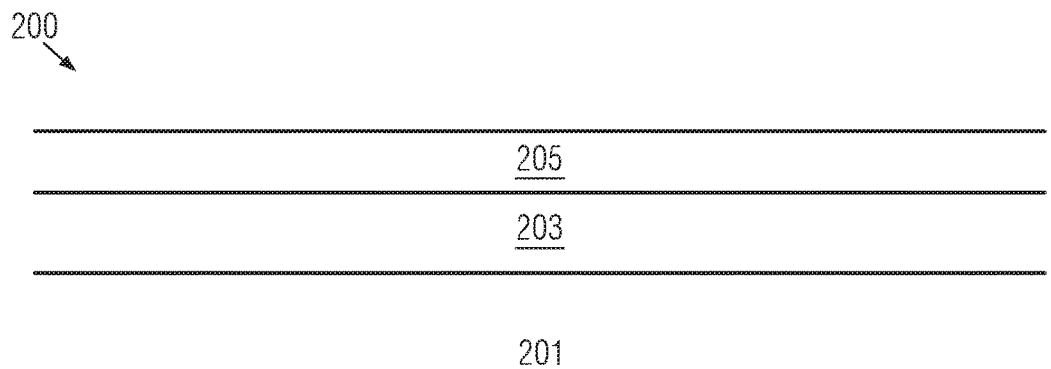
FIGS. 2a-2i schematically illustrate semiconductor devices in accordance with illustrative embodiments of the present disclosure at various stages during their fabrication.

FIG. 2a schematically illustrates a semiconductor device 200 at a very early stage during processing, particularly at a stage where an FDSOI substrate wafer is provided for further processing in accordance with front end of line (FEOL) process flows. The SOI substrate comprises a bulk substrate 201, a buried insulating material layer 203 and an active semiconductor layer 205. With regard to the illustration in FIG. 2a, the bulk substrate 201 is formed below the active semiconductor layer 205, wherein the buried insulating material layer 203 is interposed between the bulk substrate 201 and the active semiconductor layer 205.

In accordance with some illustrative embodiments of the present disclosure, the active semiconductor layer 205 may comprise one of silicon and a silicon-containing material, such as silicon germanium and the like. The buried insulating material layer 203 may be formed by an insulating material, such as an oxide material or a nitride material, e.g., silicon oxide, silicon nitride and the like. The bulk substrate 201 may comprise silicon or another appropriate semiconductor substrate used as a base substrate in the art.

For example, the active semiconductor layer 205 may have a thickness of 20 nm or less, while the buried insulating material layer 203 may have a thickness of about 145 nm or, in accordance with advanced techniques, the buried insulating material layer 203 may have a thickness in a range from 10-30 nm. In a special example, the active semiconductor layer 205 may have a thickness of 6-10 nm.

In accordance with some illustrative embodiments of the present disclosure, the SOI substrate may be provided in accordance with known techniques, such as SIMOX techniques or smart-cut processes.

In accordance with some illustrative embodiments of the present disclosure, the bulk substrate 201 may be lightly pre-doped with dopants of a first conductivity type, such as P-type dopants (e.g., boron and the like), or may be undoped. After a complete reading of the present disclosure, the person skilled in the art will appreciate that the bulk substrate 201, at the present stage during processing, as well as any subsequent stage, may not be subjected to an implantation process intended to globally dope the entire bulk substrate and the entire provided wafer (not illustrated). In accordance with some illustrative embodiments, the bulk substrate 201 may be initially provided with a very light doping or may be undoped.

Figure 2B:
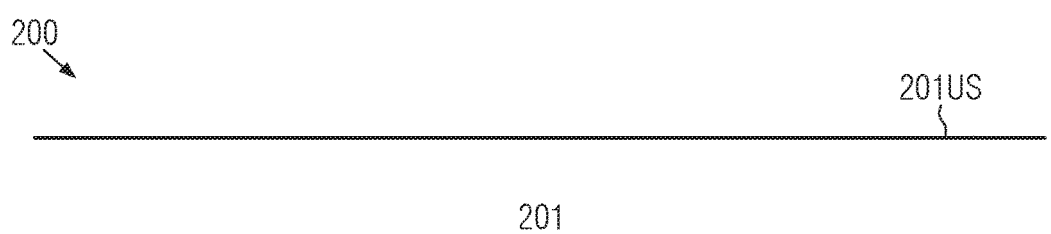

FIG. 2b schematically illustrates the semiconductor device 200 at a more advanced stage during fabrication, after a provided substrate wafer is subjected to a BULEX sequence at early stages during FEOL processing for locally removing the active semiconductor layer 205 and the buried insulating material layer 203, wherein an upper surface 201US of the bulk substrate 201 is locally exposed.

In accordance with some illustrative embodiments of the present disclosure, the BULEX sequence (not illustrated) may comprise forming a masking pattern (not illustrated, however, leaving the portion as illustrated in FIG. 2*a* exposed) by known lithography techniques, the masking pattern (not illustrated) locally leaving upper surface regions of the active semiconductor layer 205 exposed to further processing, including one or more subsequent anisotropic etch steps for sequentially removing the active semiconductor layer 205 and the buried insulating material layer 203 in accordance with the masking pattern (not illustrated), and locally exposing the upper surface of the bulk substrate 201, including the upper surface region 201US of the bulk substrate 201 as illustrated in FIG. 2*b*.

Figure 2C:
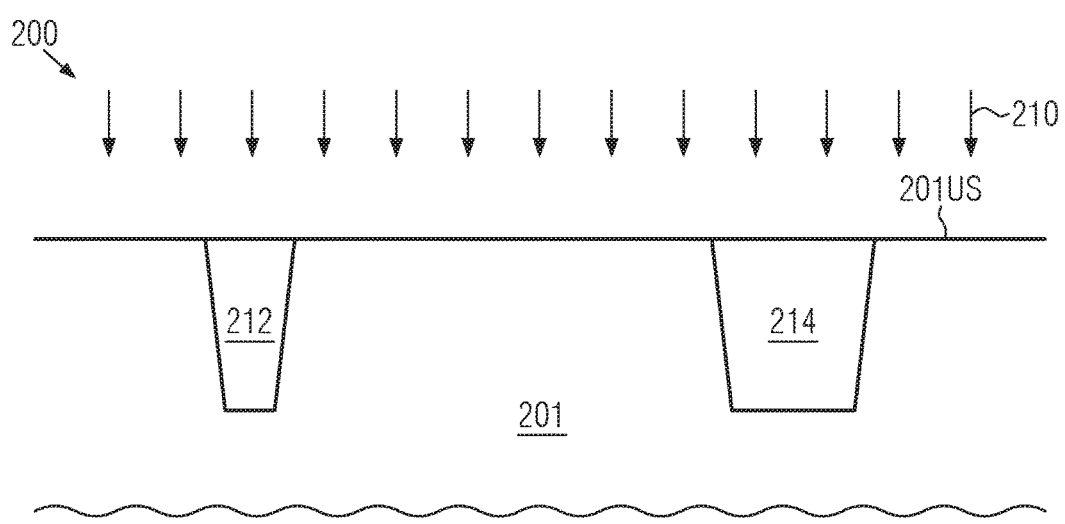

FIG. 2*c* schematically illustrates the semiconductor device 200 at a more advanced stage during fabrication, when a process 210 is performed for forming shallow trench isolation (STI) structures 212, 214 in the bulk substrate 201.

As illustrated in FIG. 2*c*, an STI region 212 and an STI 214 may be formed in an upper surface region of the bulk substrate 201 by known STI processes (e.g., performing anisotropic etching processes for forming trenches (not illustrated) within an upper surface region of exposed bulk substrate regions, and filling the trenches with an insulating material, such as an oxide and/or nitride material, thereby forming the STI regions 212 and 214).

Figure 2D:
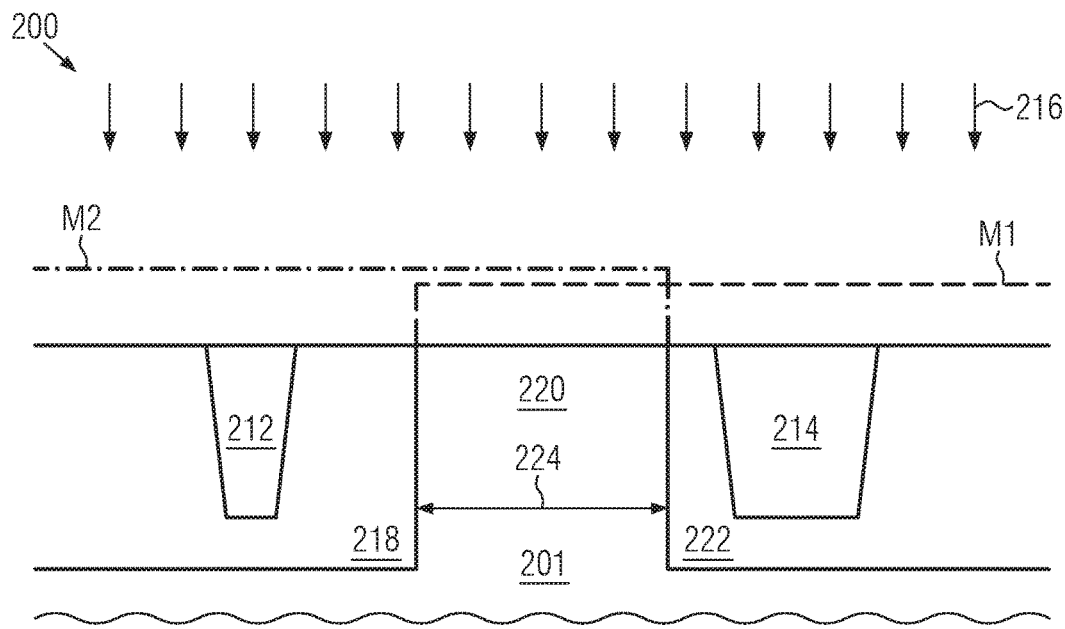

FIG. 2*d* schematically illustrates the semiconductor device 200 at a more advanced stage during fabrication after an implantation sequence 216 is completed, wherein a first well 218 and a second well 222 are formed within an upper surface region of the bulk substrate 201.

In accordance with some illustrative embodiments, the implantation sequence 216 may comprise two steps of forming a masking pattern, such as a first masking pattern M1 covering a portion of the bulk substrate 201 around the STI region 214 (as schematically indicated by a broken line designated with reference numeral M1 in FIG. 2*d*), performing an implantation with dopants of a first conductivity type in accordance with the first masking pattern M1, wherein the first well 218 is formed within the bulk substrate 201, removing the masking pattern M1, forming a second masking pattern M2 (as indicated with a dotted broken line in FIG. 2*d*), performing an implantation with dopants of a second conductivity type different from (i.e., opposite to) the first conductivity type into an upper surface region of the bulk substrate 201 in alignment with the masking pattern M2, and removing the masking pattern M2.

In accordance with some illustrative embodiments of the present disclosure, the implantation sequence 216 provides a spacing such that the first well 218 and the second well 222 are laterally separated and spaced apart by a material portion 220 of the bulk substrate 201. In accordance with some illustrative embodiments of the present disclosure, the material portion 220 may have a substantially lower concentration of dopants of the first conductivity type when compared to a concentration of dopants in the first well.

In accordance with some illustrative embodiments, a lateral spacing 224 between the first well 218 and the second well 222 may be at least 100 nm, such as at least 200 nm or at least 300 nm. After a complete reading of the present disclosure, the person skilled in the art will appreciate that alignment issues between the first well 218 and the second well 222 may be reduced or at least relaxed with increased lateral spacing 224.

The person skilled in the art will appreciate that the first well 218 and the second well 222 may be aligned with regard to the STI regions 212 and 214, that is, the masking patterns M1 and M2 may be formed in alignment with the STI regions 212 and 214, thereby the STI regions 212 and 214 providing a structure for proper positioning the masking patterns M1 and M2.

After a complete reading of the present disclosure, the person skilled in the art will appreciate that the STI region 214 is optional and may be omitted in accordance with alternative embodiments (not illustrated).

In accordance with some illustrative embodiments of the present disclosure, the first well 218 may be of a P-type, while the second well 222 may be of an N-type. Alternatively, the first well 218 may be of an N-type, while the second well 222 may be of a P-type.

In accordance with some illustrative embodiments of the present disclosure, a thermal annealing process may be performed for healing implantation damages and activating the implanted dopants.

Figure 2E:
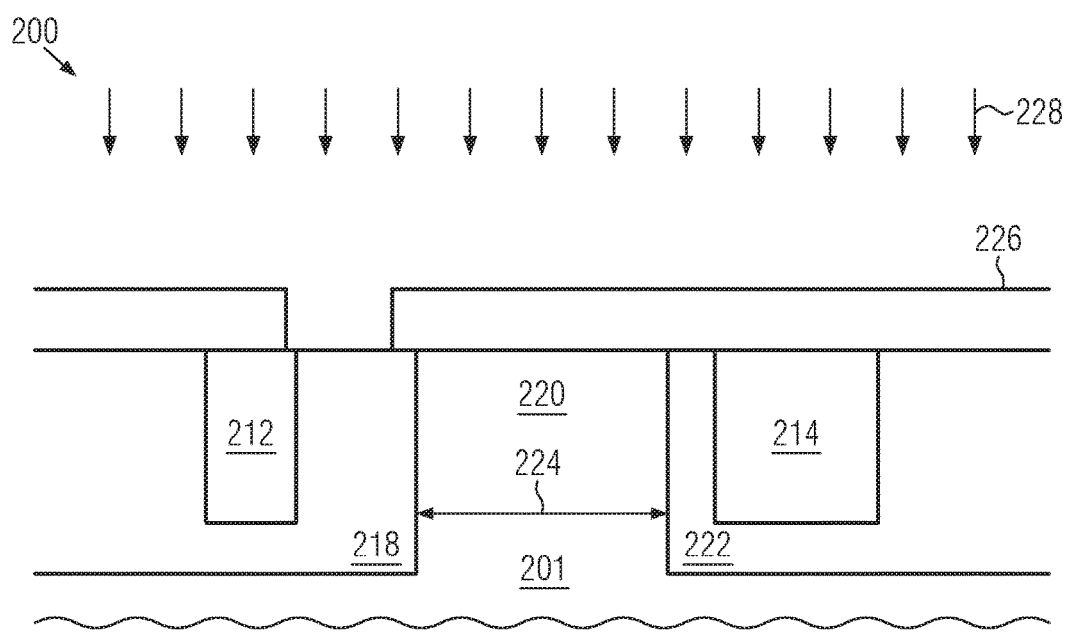

FIG. 2*e* schematically illustrates the semiconductor device 200 at a more advanced stage during fabrication, when an implantation process 228 is performed for implanting a third well (see FIG. 2*f*) within the first well 218.

In accordance with some illustrative embodiments, a masking pattern 226 may be formed over the upper surface of the bulk substrate 201, the masking pattern 226 being aligned with regard to the STI region 212. In particular, the masking pattern 226 may partially expose an upper surface of the first well 218, while covering the material portion 220 and the second well 222.

In accordance with some illustrative embodiments of the present disclosure, the implantation process 228 may comprise implanting dopants of the second conductivity type into the first well 218 in accordance with the masking pattern 226 at an implantation energy in a range from about 2-10 keV, e.g., in a range from about 4-8 keV, and at an implantation dose in a range from about 1e13/cm$^2$ to about 4e13/cm$^2$.

Figure 2F:
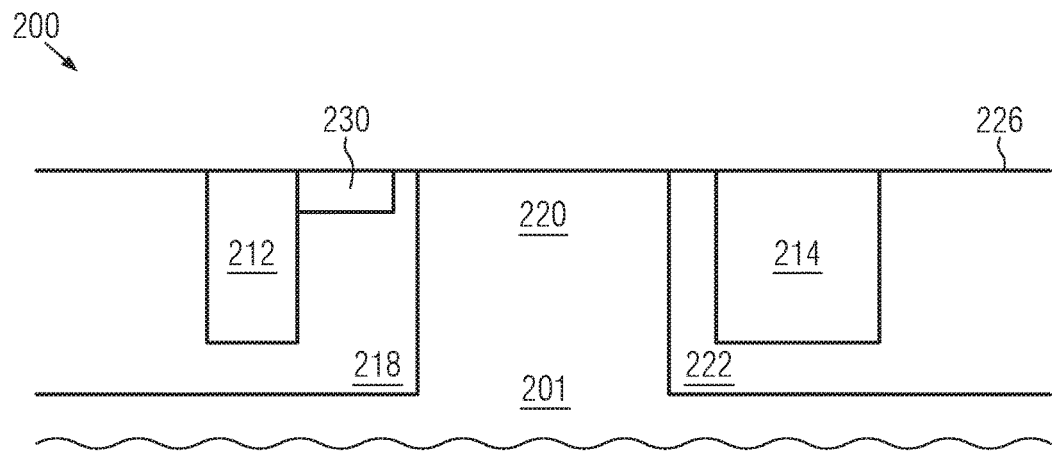

FIG. 2*f* schematically illustrates the semiconductor device 200 after the implantation process 228 is completed and the further masking pattern 226 is removed. Accordingly, a third well 230 is provided within the first well 218 in alignment with the STI region 212.

In accordance with some illustrative embodiments of the present disclosure, the third well 230 may be formed by doping with dopants of a donor type, such as phosphorous or the like, in case of NLDMOSFETs, while dopants of an acceptor type, e.g., boron or the like, may be used in case of PLDMOSFETs.

Figure 2G:
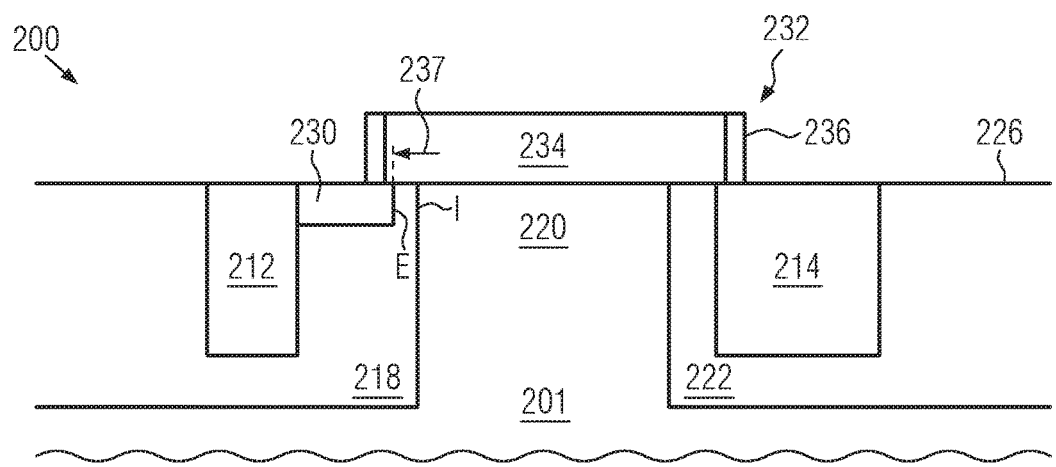

FIG. 2*g* schematically illustrates the semiconductor device 200 at a more advanced stage during fabrication, after a gate structure 232 partially overlying each of the first well 218, the second well 222, and the third well 230 is formed.

In accordance with some illustrative embodiments, the gate structure 232 may comprise a gate stack 234 comprising a gate dielectric and a gate electrode material, and sidewall spacers 236 covering sidewalls of the gate stack 234. In accordance with some special illustrative examples herein, the gate structure 232 may be formed in accordance with known HKMG techniques.

In accordance with some illustrative embodiments of the present disclosure, the gate structure 232 may overlap the third well 230 by a distance as indicated by an arrow 237 in FIG. 2g. An amount of the overlap 237 may be determined in accordance with a target threshold voltage to be implemented in the semiconductor device 200.

In accordance with some illustrative embodiments of the present disclosure, the gate structure 232 may overlap at least one of the first well 218 and the second well 222 by at most 100 nm, such as 58 nm or less.

In accordance with some illustrative embodiments of the present disclosure, a target threshold value to be implemented in the semiconductor device 200 may be designed by appropriately implementing a spacing between an edge E of the third well 230 and an interface I between the first well 218 and the material portion 220. For example, an amount of overlap, e.g., the overlap 237 in FIG. 2g, may be based on the spacing between the edge E of the third well 230 and the interface I between the first well 218 and the material portion 220.

Figure 2H:
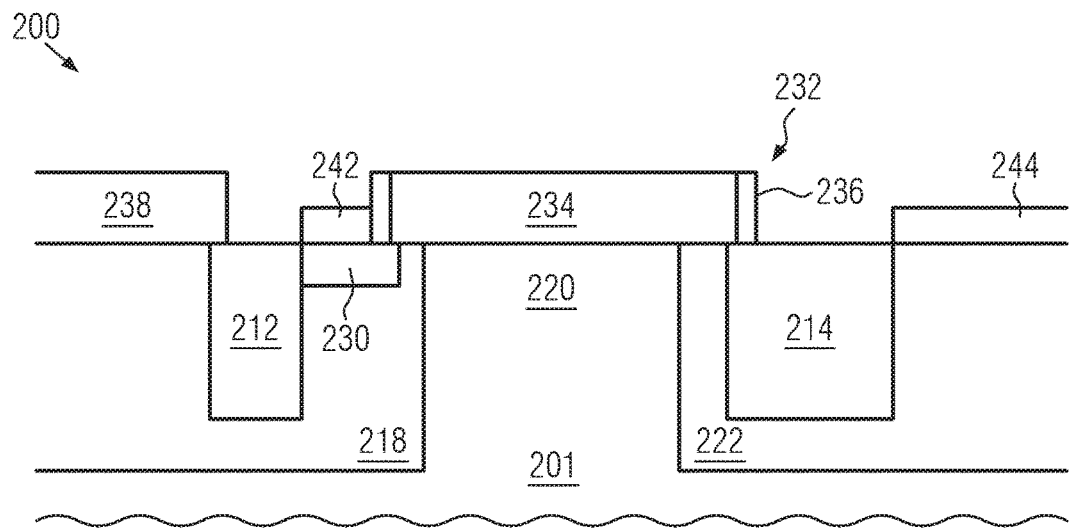

FIG. 2h schematically illustrates the semiconductor device 200 at a more advanced stage during fabrication, after an epitaxial growth process (not illustrated) is performed, wherein epi regions 242 and 244 are grown on the third well 230 and the second well 222 in alignment with the gate structure 232, the STI regions 212 and 214, and a masking pattern 238 covering a remaining surface of the first well 218 outside the third well 230.

In accordance with some illustrative embodiments of the present disclosure, the epi regions 242 and 244 may be strongly doped with N-type dopants in case of NLDMOSFETs, or strongly doped with P-type dopants in case of PLDMOSFETs. The doping of the epi regions 242 and 244 may be provided when epitaxially growing the epi regions 242 and 244.

The person skilled in the art will appreciate that, in accordance with some illustrative embodiments of the present disclosure, source and drain regions may be provided by the epi regions 242 and 244.

Figure 2I:
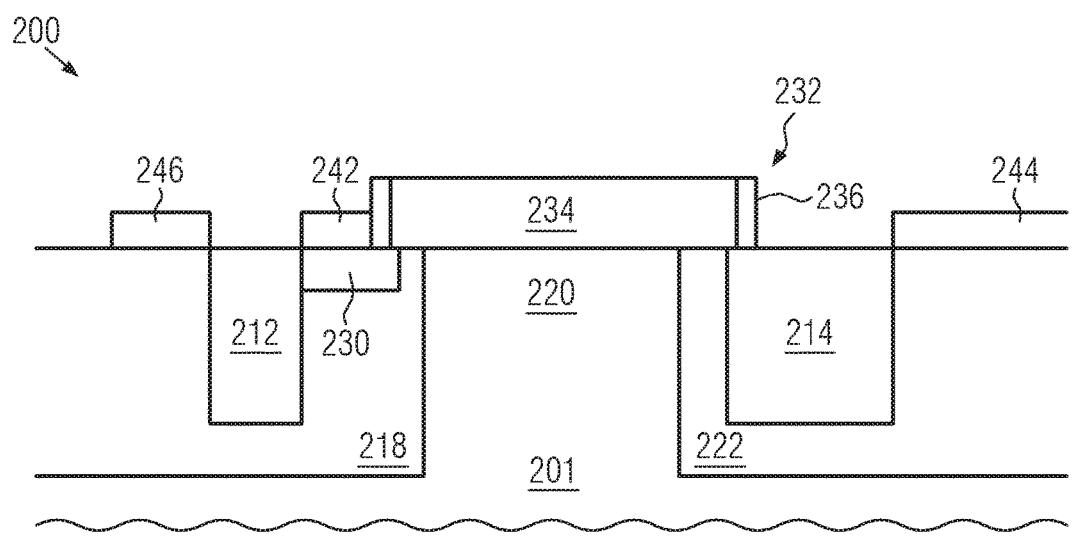

FIG. 2i schematically illustrates the semiconductor device 200 at a more advanced stage during fabrication, after the masking pattern 238 is removed and after a masking pattern (not illustrated) covering the epi regions 242 and 244, as well as the gate structure 232, is formed and an epitaxial growth process (not illustrated) is performed, wherein an epi region 246 is formed.

In accordance with some illustrative embodiments, the epi region 246 may be laterally spaced apart from the gate structure 232 by a distance greater than the epi region 242. The epi regions 246 and 242 may be separated by the STI region 212.

In accordance with some illustrative embodiments of the present disclosure, the epi region 246 may be doped with dopants of the first conductivity type, that is, the epi region 246 and the first well 218 may be doped with dopants of the same conductivity type. Accordingly, a back bias to the first well 218 may be provided via the epi region 246.

The person skilled in the art will appreciate that, in accordance with some illustrative embodiments of the present disclosure, a back bias contact region may be provided by the epi region 246.

Although embodiments above are described as comprising the epi region 244, this does not pose any limitation to the present disclosure, and the person skilled in the art being aware of the present disclosure will appreciate that a silicide region may be provided directly within the second well 222 instead of the epi region 244, the silicide region within the second well 222 being aligned with regard to the STI region 214.

In accordance with some alternative (and not illustrated) embodiments of the present disclosure, formation of the gate structure 232 may comprise forming a field oxide (not illustrated) over the bulk substrate 201, after the implantation sequence 216 in FIG. 2d is completed. Upon locally thinning the field oxide to a desired thickness for implementing a gate dielectric, the gate structure 232 may be formed, when depositing a gate electrode material on the locally thinned field oxide and subsequently patterning the field oxide and the deposited gate electrode material.

Although the embodiments above show the STI region 214, this does not pose any limitation to the present disclosure and the person skilled in the art will appreciate that the STI region 214 may be omitted.

The person skilled in the art will appreciate that the process flow as schematically illustrated in FIG. 2i may be continued by applying a silicide module so as to form silicide contact structures for electrically contacting the epi regions 246, 242, 244, and the gate stack 234.

In accordance with some illustrative embodiments of the present disclosure, semiconductor devices may support drain side voltages of about 3.3 V or 5 V or higher.

In accordance with some illustrative embodiments that omit the STI region 214, the deposition of the highly doped epi material on the second well 222 may be blocked by an appropriate silicide block liner (not illustrated) which is parallelly formed in process sequences performed when forming resistor structures on the remaining wafer substrate (not illustrated), the silicide block liner being used to prevent the silicidation of the substrate surface after the epitaxial growth of epi material on the second well 222 is blocked.

In accordance with some illustrative embodiments of the present disclosure, semiconductor devices having a gate overlap in the first well by 100 nm may be provided. According devices were tested and showed a threshold voltage of about 0.7 V at a drain saturation current in between 400 to 450 µA/µm.

In accordance with some illustrative embodiments of the present disclosure having a gate overlap of 50 nm, semiconductor devices having a threshold voltage of about 0.5 V at a drain saturation current of about 500 to 550 µA/µm were obtained.

By comparison, conventional semiconductor devices were tested and showed threshold voltages of higher than 0.8 V at drain saturation currents of less than 370 µA/µm.

In accordance with some illustrative embodiments of the present disclosure, semiconductor devices were obtained that showed a subthreshold slope of improved behavior, that is, a subthreshold slope becoming smaller with lower threshold voltage and shorter intrinsic channel length.

In summary, the present disclosure relates to device targeting and performance of pure slave LDMOSFETs in FDSOI technologies, wherein a method for fine tuning targeting per litho process is provided. In accordance with some illustrative embodiments of the present disclosure, higher drive currents with regard to several LDMOSFET constructions in FDSOI techniques were obtained.

The embodiments of the present disclosure can achieve several technical effects and enjoy industrial applicability in any technologies employing high voltage transistors, such as automobiles, display electronics, telecommunications, power converters and the like. In the preceding description, the present disclosure is described with reference to specifically exemplary embodiments thereof. It will, however, be evident that various modifications and changes may be made thereto without departing from the broader spirit and scope of the present disclosure as set forth in the claims. The specification and drawings are accordingly to be regarded as illustrative and not as restrictive. It is understood that the present disclosure is capable of using various other combinations and embodiments and is capable of any changes or modifications within the scope of the inventive concept as expressed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    a substrate;
    a first well and a second well formed in said substrate, said first well being doped with dopants of a first conductivity type and said second well being doped with dopants of a second conductivity type;
    a third well formed within said first well;
    a gate structure partially formed over said first, second and third wells;
    a first epi region formed on said third well, said first epi region being doped with dopants of said second conductivity type; and
    a drain region electrically coupled to said second well.

2. The semiconductor device of claim 1, wherein an edge of said third well has a predetermined spacing from an edge of said first well, said spacing being determined based on a target threshold voltage of said semiconductor device.

3. The semiconductor device of claim 1, wherein said first well and said second well are laterally separated by a material portion of said substrate, said material portion having a substantially lower concentration of dopants of said first conductivity type when compared to a concentration of dopants in said first well.

4. The semiconductor device of claim 3, wherein said first well is doped with boron and said second well is doped with phosphorus.

5. The semiconductor device of claim 1, further comprising a second epi region formed on said first well and doped with dopants of said first conductivity type, wherein a lateral separation distance between said second epi region and said gate structure is greater than a lateral separation distance between said first epi region and said gate structure.

6. The semiconductor device of claim 5, further comprising a shallow trench isolation (STI) formed within said first well, said STI separating said first and second epi regions.

7. The semiconductor device of claim 5, wherein said second epi region is in direct contact with said first well.

8. The semiconductor device of claim 1, further comprising a shallow trench isolation (STI) formed within said second well, said STI being located between said gate structure and said drain region.

9. The semiconductor device of claim 1, wherein said drain region is formed by a third epi region disposed on said second well.

10. The semiconductor device of claim 1, wherein said third epi region is doped with dopants of said second conductivity type.

11. The semiconductor device of claim 1, wherein said drain region is formed by a silicide region formed within said second well.

12. The semiconductor device of claim 1, wherein said substrate is comprised of an SOI configuration further comprising a semiconductor layer and a buried insulating material layer formed between said semiconductor layer and said substrate, said semiconductor layer and said buried insulating material layer being locally removed in an active region in which said semiconductor device is formed.

13. The semiconductor device of claim 1, wherein said first and second well regions are separated by at least about 100 nm.

14. The semiconductor device of claim 1, wherein said gate structure overlaps at least one of said first and second wells by at most 100 nm.

15. A semiconductor device, comprising:
    an SOI substrate comprising a bulk semiconductor substrate, a semiconductor layer positioned above said bulk semiconductor substrate, and a buried insulating material layer positioned between said bulk semiconductor substrate and said semiconductor layer;
    a first well formed in said bulk semiconductor substrate, wherein said first well is doped with dopants having a first conductivity type;
    a second well formed in said bulk semiconductor substrate, wherein said second well is doped with dopants having a second conductivity type, and wherein a first edge of said first well is laterally separated from a second edge of said second well by a first portion of said bulk semiconductor substrate;
    a third well formed within said first well;
    a gate structure positioned on said bulk semiconductor substrate, said gate structure extending over a third edge of said third well, said first edge of said first well, said first portion of said bulk semiconductor substrate, and said second edge of said second well;
    a first epi region positioned on said third well, wherein said first epi region is doped with dopants of said second conductivity type;
    a second epi region positioned on said second well, wherein said second epi region is doped with dopants of said second conductivity type; and
    a third epi region positioned on said first well, wherein said third epi region is doped with dopants of said first conductivity type.

16. The semiconductor device of claim 15, wherein said first epi region comprises a source region of said semiconductor device and said second epi region comprises a drain region of said semiconductor device.

17. The semiconductor device of claim 15, wherein said third epi region comprises a back bias contact region of said semiconductor device.

18. The semiconductor device of claim 15, wherein said third edge of said third well is laterally separated from said first edge of said first well by a lateral separation distance.

19. The semiconductor device of claim 15, wherein a lateral separation distance between said second epi region and said gate structure is greater than a lateral separation distance between said first epi region and said gate structure.

20. The semiconductor device of claim 15, wherein said third epi region is laterally separated from said first epi region by a trench isolation structure.

* * * * *